(12) United States Patent
Liang et al.

(10) Patent No.: US 9,082,877 B2
(45) Date of Patent: Jul. 14, 2015

(54) COMPLEMENTARY METAL OXIDE SEMICONDUCTOR (CMOS) DEVICE HAVING GATE STRUCTURES CONNECTED BY A METAL GATE CONDUCTOR

(71) Applicant: International Business Machines Corporation, Armonk, NY (US)

(72) Inventors: Yue Liang, Beacon, NY (US); Dureseti Chidambarrao, Weston, CT (US); Brian J. Greene, Wappingers Falls, NY (US); William K. Henson, Beacon, NY (US); Unoh Kwon, Fishkill, NY (US); Shreesh Narasimha, Beacon, NY (US); Xiaojun Yu, Sunnyvale, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/292,312

(22) Filed: May 30, 2014

(65) Prior Publication Data
US 2014/0349451 A1    Nov. 27, 2014

Related U.S. Application Data

(62) Division of application No. 13/342,435, filed on Jan. 3, 2012, now Pat. No. 8,803,243.

(51) Int. Cl.
*H01L 21/8238* (2006.01)
*H01L 21/28* (2006.01)
*H01L 21/306* (2006.01)
*H01L 21/762* (2006.01)
*H01L 29/49* (2006.01)

(52) U.S. Cl.
CPC .. *H01L 21/823871* (2013.01); *H01L 21/28079* (2013.01); *H01L 21/30604* (2013.01); *H01L 21/76224* (2013.01); *H01L 21/823878* (2013.01); *H01L 29/4958* (2013.01)

(58) Field of Classification Search
CPC .................... H01L 21/8238; H01L 27/0922
USPC ......... 257/239, 261, 315, 377, 382, 388, 413, 257/755, E27.062, E21.632; 438/201, 587, 438/593, 631, 655, 669, 682
See application file for complete search history.

(56) References Cited

U.S. PATENT DOCUMENTS

| | | |
|---|---|---|
| 4,920,073 A | 4/1990 | Wei et al. |
| 5,100,838 A | 3/1992 | Dennison |
| 5,168,076 A | 12/1992 | Godinho et al. |

(Continued)

*Primary Examiner* — Elias M Ullah
(74) *Attorney, Agent, or Firm* — Scully, Scott, Murphy & Presser, P.C.; H. Daniel Schnurmann

(57) ABSTRACT

A complementary metal oxide semiconductor (CMOS) device including a substrate including a first active region and a second active region, wherein each of the first active region and second active region of the substrate are separated by from one another by an isolation region. A n-type semiconductor device is present on the first active region of the substrate, in which the n-type semiconductor device includes a first portion of a gate structure. A p-type semiconductor device is present on the second active region of the substrate, in which the p-type semiconductor device includes a second portion of the gate structure. A connecting gate portion provides electrical connectivity between the first portion of the gate structure and the second portion of the gate structure. Electrical contact to the connecting gate portion is over the isolation region, and is not over the first active region and/or the second active region.

14 Claims, 9 Drawing Sheets

(56) References Cited

U.S. PATENT DOCUMENTS

| | | | |
|---|---|---|---|
| 5,172,211 A | 12/1992 | Godinho et al. |
| 5,714,411 A | 2/1998 | Trahan et al. |
| 5,744,839 A | 4/1998 | Ma et al. |
| 5,940,693 A | 8/1999 | Maekawa |
| 6,004,838 A | 12/1999 | Ma et al. |
| 6,146,994 A | 11/2000 | Hwang |
| 6,162,675 A | 12/2000 | Hwang et al. |
| 6,211,044 B1 | 4/2001 | Xiang et al. |
| 6,242,779 B1 | 6/2001 | Maekawa |
| 6,326,669 B1 | 12/2001 | Hwang et al. |
| 6,350,676 B1 | 2/2002 | Baldi |
| 6,383,882 B1 | 5/2002 | Lee et al. |
| 6,403,472 B1 | 6/2002 | Woodbury et al. |
| 6,602,774 B1 | 8/2003 | Fontana et al. |
| 6,613,654 B1 | 9/2003 | DeBoer et al. |
| 6,614,082 B1 | 9/2003 | DeBoer et al. |
| 6,667,523 B2 | 12/2003 | Woodbury et al. |
| 6,700,163 B2 | 3/2004 | Breitwisch et al. |
| 6,849,495 B2 | 2/2005 | Wensley et al. |
| 6,855,989 B1 | 2/2005 | Wang et al. |
| 6,872,639 B2 | 3/2005 | DeBoer et al. |
| 6,881,672 B2 | 4/2005 | Breitwisch et al. |
| 6,936,882 B1 | 8/2005 | Ahmed et al. |
| 7,196,382 B2 | 3/2007 | Kruger et al. |
| 7,223,647 B2 | 5/2007 | Hsu et al. |
| 7,488,637 B2 | 2/2009 | Kim |
| 7,501,345 B1 | 3/2009 | Basker et al. |
| 7,601,636 B2 | 10/2009 | Dumas et al. |
| 7,691,751 B2 | 4/2010 | Min et al. |
| 7,875,513 B2 | 1/2011 | Pellizzer et al. |
| 7,875,959 B2 | 1/2011 | Ke et al. |
| 7,927,942 B2 | 4/2011 | Raaijmakers |
| 2010/0178772 A1 | 7/2010 | Lin et al. |

COMPLEMENTARY METAL OXIDE SEMICONDUCTOR (CMOS) DEVICE HAVING GATE STRUCTURES CONNECTED BY A METAL GATE CONDUCTOR

CROSS REFERENCE TO RELATED APPLICATION

This application is a divisional of U.S. patent application Ser. No. 13/342,435, filed Jan. 3, 2012 the entire content and disclosure of which is incorporated herein by reference.

BACKGROUND

The present disclosure relates to semiconductor devices, and more particularly to electrical contacts to the gate structures of semiconductor devices.

Current complementary metal oxide semiconductor (CMOS) technology uses silicides as contacts to source/drain (S/D) regions and gate structures of the n-type and p-type semiconductor devices. In order to be able to make integrated circuits (ICs), such as CMOS devices, of higher integration density than currently feasible, one has to find ways to further downscale the dimensions of field effect transistors (FETs). Scaling achieves compactness and improves operating performance in devices by shrinking the overall dimensions and operating voltages of the device while maintaining the device's electrical properties. However, with increased scaling, the etch processes that are typically used in forming the semiconductor devices may not have the controllability that is required for manufacturing.

SUMMARY

In one embodiment, a complementary metal oxide semiconductor (CMOS) device is provided that includes a substrate including at least one first active region and at least one second active region, wherein each of the at least one first active region and each of the at least one second active region of the substrate are separated from one another by an isolation region positioned therebetween. An n-type semiconductor device is present on at least one of the first active regions of the substrate, in which the n-type semiconductor device includes a first portion of a gate structure including at least one gate conductor layer. A p-type semiconductor device is present on at least one of the second active regions of the substrate, in which the p-type semiconductor device includes a second portion of the gate structure that includes the at least one gate conductor layer. Electrical connectivity between the first portion of the gate structure and the second portion of the gate structure is provided by a connecting gate portion that is present on the isolation region. An interconnect is in direct contact with an upper surface of the at least one gate conductor layer of the connecting portion of the gate structure. A dielectric cap layer is present on the upper surface of the first portion of the gate structure in the at least one first active region, and is present on the upper surface of the second portion of the gate structure in the at least one second active region.

In another aspect, a method of forming a complementary metal oxide semiconductor (CMOS) device is provided, which in one embodiment may include
forming at least one isolation region in a substrate to provide at least one first active region and at least one second active region, and forming a gate structure extending across the at least one isolation region and spanning from the at least one first active region to the at least one second active region. The gate structure includes at least one gate dielectric layer, at least one gate conductor layer, and at least one dielectric cap layer. A first source region and a first drain region of a first conductivity type are formed on opposing sides of the gate structure in the at least one first active region. A second source region and a second drain region of a second conductivity type are formed on opposing sides of the gate structure in the at least one second active region. An opening is formed in a portion of the at least one dielectric cap layer to expose a contact portion of the at least one gate conductor layer over the at least one isolation region, in which a remaining portion of the at least one dielectric cap layer is present over the at least one first active region and the at least one second active region. An interconnect is formed in direct contact with the contact portion of the at least one gate conductor layer.

DESCRIPTION OF THE DRAWINGS

The following detailed description, given by way of example and not intended to limit the disclosure solely thereto, will best be appreciated in conjunction with the accompanying drawings, wherein like reference numerals denote like elements and parts, in which:

FIGS. 5A and 5B depict forming an interconnect in contact with the metal semiconductor alloy depicted in FIGS. 4A-4D, in which FIG. 5A is a side cross-sectional view along section line C-C as depicted in FIG. 4B and FIG. 5B is a side cross-sectional view along section line D-D as depicted in FIG. 4B, in accordance with one embodiment of the present disclosure.

FIG. 6A is a top down planar view. FIG. 6B is a side cross-sectional view along section line B-B as depicted in FIG. 6A. FIG. 6C is a side cross-sectional view along section line C-C as depicted in FIG. 6A.

FIGS. 7A and 7B depict forming a contact in electrical contact with the exposed portion of the metal gate conductor layer depicted in FIGS. 6A-6D, in which FIG. 7A is a side cross-sectional view along section line C-C as depicted in FIG. 6B and FIG. 7B is a side cross-sectional view along section line D-D as depicted in FIG. 6B, in accordance with one embodiment of the present disclosure.

DETAILED DESCRIPTION

Figure 1A:
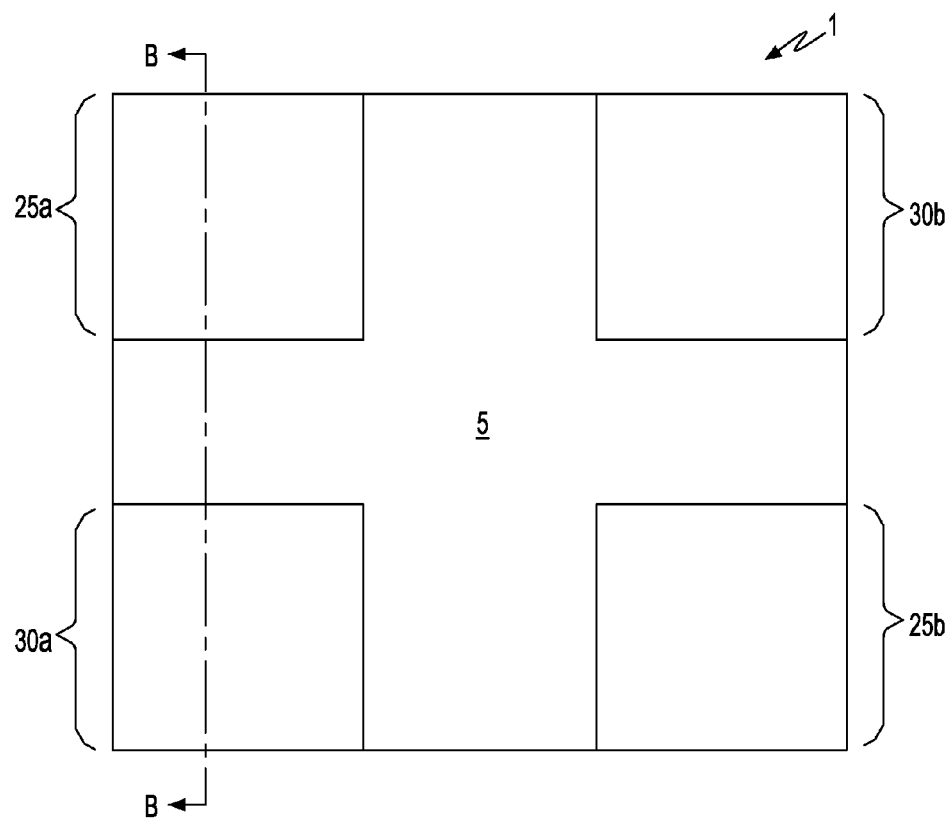
FIG. 1A is a top down planar view of a substrate including first active regions and second active regions, wherein each of the first active regions and each of the second active regions of the substrate are separated by from one another by an isolation region positioned therebetween, in accordance with one embodiment of the present disclosure.
Figure 1B:
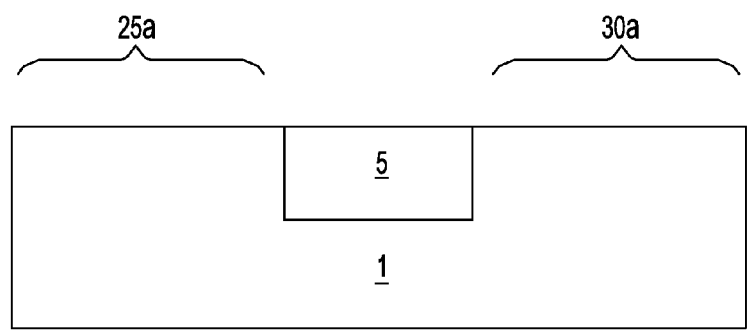
FIG. 1B is a side cross-sectional view along section line B-B of FIG. 1A.

Detailed embodiments of the present disclosure are described herein; however, it is to be understood that the disclosed embodiments are merely illustrative of the methods and structures that may be embodied in various forms. In addition, each of the examples given in connection with the various embodiments of the disclosure is intended to be illustrative, and not restrictive.

Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

It has been determined that removing the dielectric cap layer from the upper surface of a semiconductor gate conductor layer prior to forming a metal semiconductor alloy, such as a silicide contact, on the portion of the gate structure that is overlying the channel region of semiconductor devices may become particularly challenging as semiconductor devices are scaled to increasing smaller dimensions. For example, if the etch process for removing the dielectric cap layer does not remove the gate dielectric cap in its entirety, yield of semiconductor devices during manufacturing may be degraded. In another example, the etch process for removing the dielectric cap from the portion of the gate conductor that is overlying the channel damages the dielectric spacers that are abutting the gate structure, which may degrade semiconductor device performance.

FIGS. 1A-5B depict one embodiment of the present disclosure that overcomes the above disadvantages by removing a portion of the dielectric cap layer 20 of the gate structure 10a, 10b to expose an underlying portion of the semiconductor gate conductor layer 15a that is present on an isolation region 5, and by forming an interconnect 55 to the exposed portion of the semiconductor gate conductor layer 15a. Because the interconnect 55 is formed to a portion of the gate structure 10a, 10b that is present over the isolation region 5, the method of the present disclosure does not damage the portions of the gate structure 10a, 10b that are present over the active regions 25a, 25b, 30a, 30b of the substrate 1 with the process steps that form the interconnect 55. Further, during the process sequence that provides the interconnect 55 to the gate structures 10a, 10b, the active regions 25a, 25b, 30a, 30b themselves are protected from being damaged.

As used herein, a "semiconductor device" is an intrinsic semiconductor material that has been doped, i.e., into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. Although the semiconductor devices that are depicted in figures of the present disclosure are field effect transistors (FET), it is noted that any semiconductor device that includes a gate structure to switch the device from an "on" state to an "off" state is suitable for use with the methods and structures of the present disclosure. A "field effect transistor (FET)" is a semiconductor device in which the output current, i.e., source-drain current, is controlled by the voltage applied to the gate. A FET has three terminals, i.e., gate structure, source region and drain region. The term "gate structure" means a structure used to control output current (i.e., flow of carriers in the channel) of a semiconducting device through electrical or magnetic fields.

In one embodiment, the method of the present disclosure may begin with providing a substrate 1 including first active regions 25a, 25b and second active regions 30a, 30b, wherein each of the first active regions 25a, 25b and each of the second active regions 30a, 30b of the substrate 1 are separated by from one another by an isolation region 5 positioned therebetween. Although the supplied figures only depict two first active regions 25a, 25b and two second active regions 30a, 30b, it is not intended that the present disclosure be limited to only this embodiment, as any number of active regions 25a, 25b, 30a, 30b in the substrate 1 are within the scope of the present disclosure. The substrate 1 may be composed of a silicon containing material. Silicon containing materials suitable for the substrate 1 include, but are not limited to, Si, single crystal Si, polycrystalline Si, SiGe, single crystal silicon germanium, polycrystalline silicon germanium, or silicon doped with carbon, amorphous Si and combinations and multi-layers thereof. The substrate 1 may also be composed of other semiconductor materials, such as germanium, and compound semiconductor substrates, such as type III/V semiconductor substrates, e.g., GaAs. Although the substrate 1 is depicted as a bulk semiconductor substrate, semiconductor on insulator (SOI) substrate arrangements, such as silicon on insulator substrates, are also suitable for the substrate 1.

The substrate 1 may be etched to provide a trench that defines the at least one first active region 25a, 25b and the at least one second active region 30a, 30b. In one embodiment, the trench is formed using a dry etching process, such as reactive-ion etching (RIE) or plasma etching. Following formation, the trench is filled with a dielectric to provide an isolation region 5. Prior to deposition of the fill dielectric, the trenches may be lined with a liner material that may function as a diffusion barrier, e.g., a silicon nitride liner. Chemical vapor deposition (CVD) or another like deposition process may be used to fill the trench with a dielectric material, such as silicon oxide ($SiO_2$). The dielectric that is deposited within the trench may optionally be densified after deposition. A planarization process, such as chemical-mechanical polishing (CMP), may optionally be used to provide a planar structure.

The terms "active" as used to describe the first active regions 25a, 25b and the second active regions 30a, 30b means that the designated portion of the substrate 1 contains at least the channel region, the source region and the drain region of a semiconductor device. In some embodiments, a raised source region and a raised drain region may be contained within the active region. In one embodiment, the first active regions 25a, 25b provide the site for a subsequently formed n-type semiconductor devices, and the second active regions 30a, 30b provide the sites for subsequently formed p-type semiconductor devices. In this example, the first active regions 25a, 25b may include a well region of a p-type conductivity, and the second active regions 30a, 30b may include a well region of an n-type conductivity. As used herein, the term "conductivity type" denotes a dopant region being p-type or n-type. As used herein, "p-type" refers to the addition of impurities to an intrinsic semiconductor that creates deficiencies of valence electrons. In a semiconductor material from group IV of the Periodic Table of Elements, such as silicon, examples of n-type dopants, i.e., impurities, include but are not limited to, boron, aluminum, gallium and indium. As used herein, "n-type" refers to the addition of impurities that contributes free electrons to an intrinsic semiconductor. In a semiconductor material from group IV of the Periodic Table of Elements, examples of n-type dopants, i.e., impurities, include but are not limited to antimony, arsenic and phosphorous. The concentration of dopant in the well region of the first active regions 25a, 25b, and/or the second active regions 30a, 30b may range from 1e16 atoms/cm$^3$ to 1e20 atoms/cm$^3$.

Figure 2A:
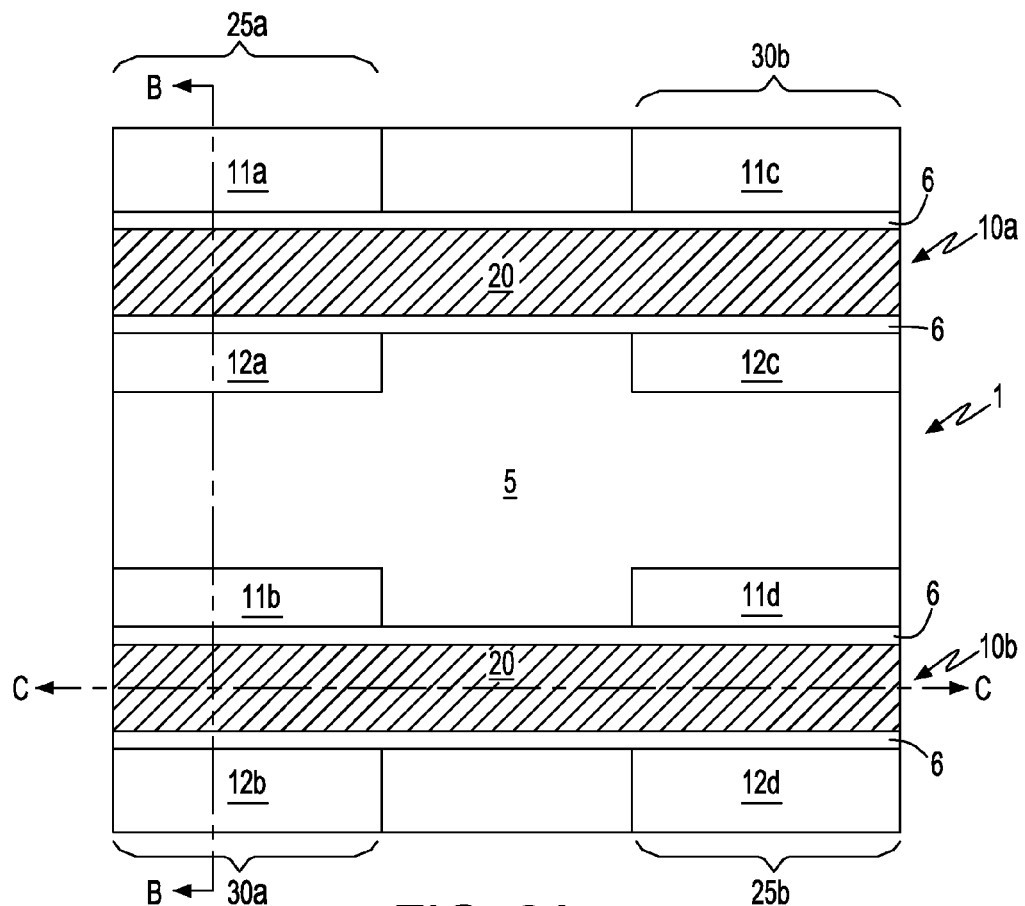
FIG. 2A is a top down planar view that depicts forming gate structures extending across the isolation region and spanning from the first active regions to the second active regions, wherein each of the gate structures includes a dielectric cap layer, a semiconductor gate conductor layer, a metal gate conductor layer and a gate dielectric layer, in accordance with one embodiment of the present disclosure.
Figure 2B:
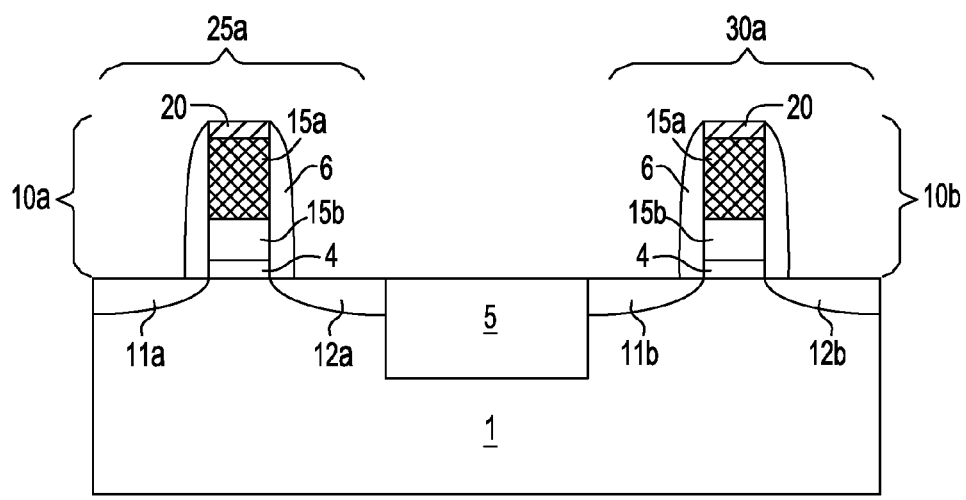
FIG. 2B is a side cross-sectional view along section line B-B of FIG. 2A.
Figure 2C:
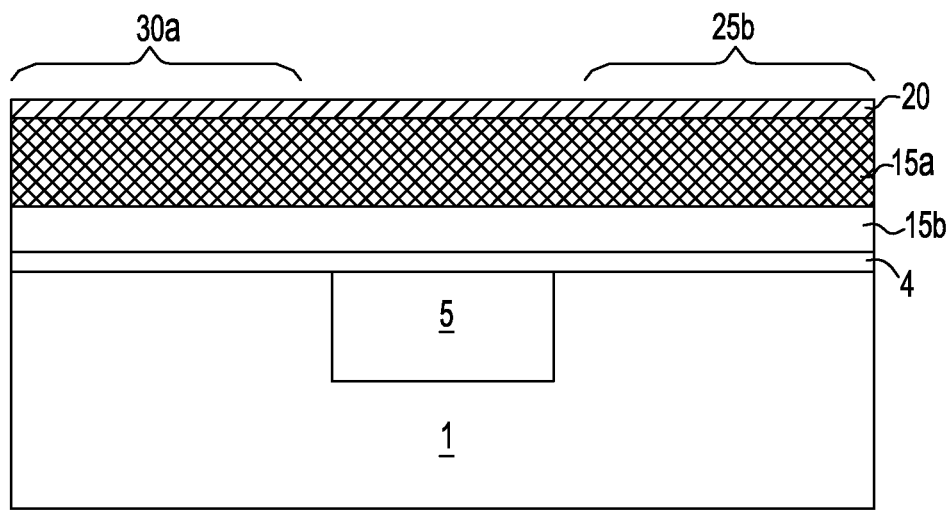
FIG. 2C is a side cross-sectional view along section line C-C of FIG. 2A.
Figure 3A:
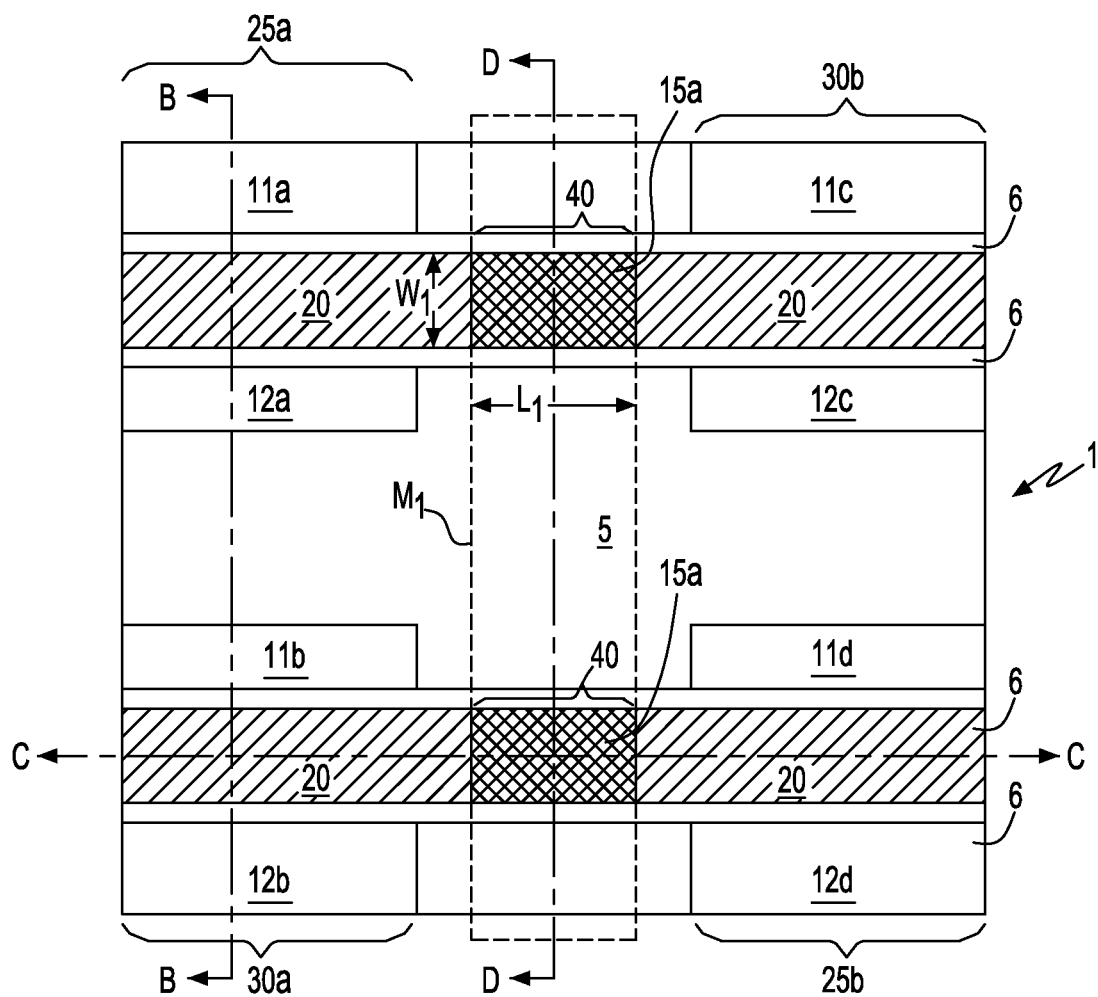
FIG. 3A is a top down planar view that depicts forming an opening in a portion of the dielectric cap layer to expose a contact portion of the semiconductor gate conductor layer over the isolation region, wherein a remaining portion of the dielectric cap layer is present over the first active regions and the second active regions, in accordance with one embodiment of the present disclosure.
Figure 3B:
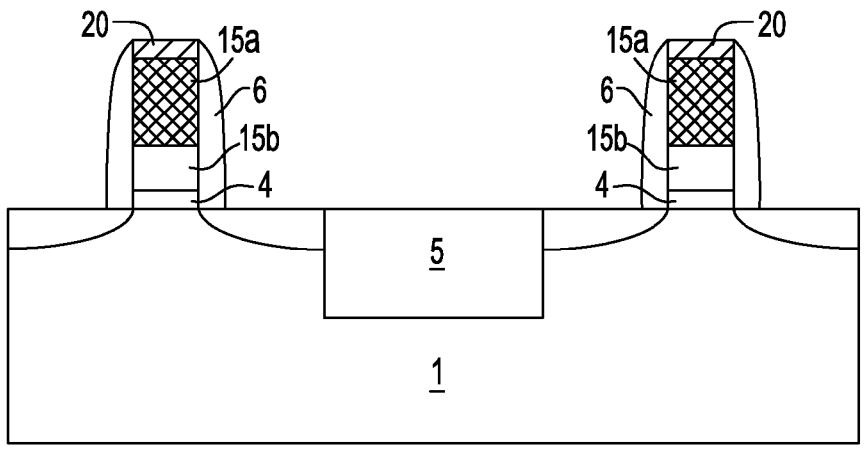
FIG. 3B is a side cross-sectional view along section line B-B of FIG. 3A.
Figure 3C:
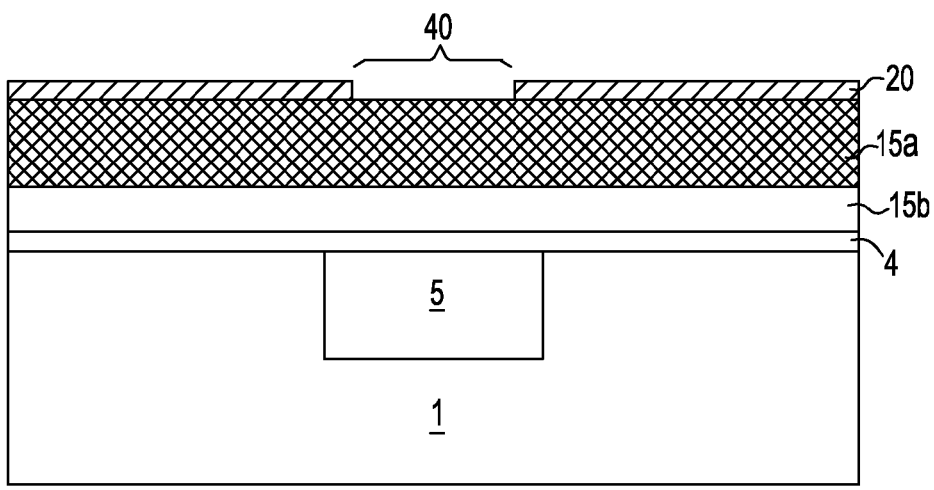
FIG. 3C is a side cross-sectional view along section line C-C of FIG. 3A.
Figure 3D:
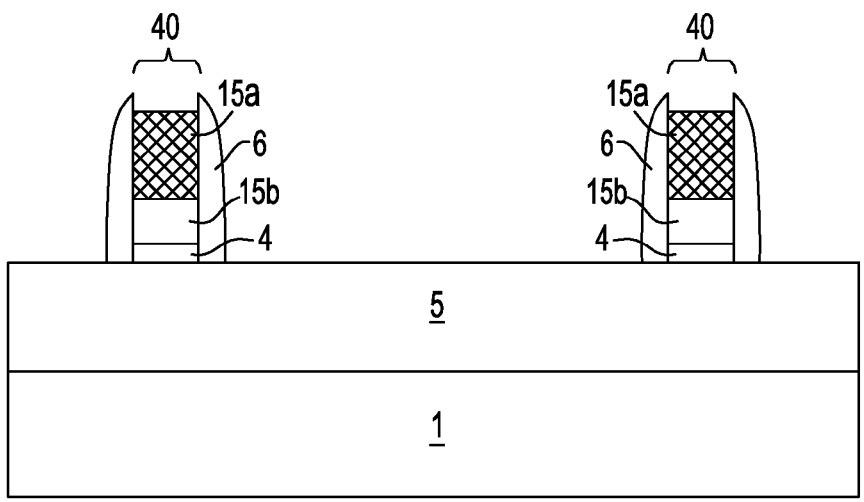
FIG. 3D is a side cross-sectional view along section line D-D of FIG. 3A.

FIGS. 2A-2C depict one embodiment of forming gate structures 10a, 10b extending across the isolation region 5 and spanning from the first active regions 25a, 25b to the second active regions 30a, 30b. Each of the gate structures 10a, 10b may include at least one dielectric cap layer 20, at least one semiconductor gate conductor layer 15a, at least one metal gate conductor layer 15b and at least one gate dielectric layer 4.

The at least one gate dielectric layer 4 can be formed by a thermal growing process, such as, e.g., oxidation, nitridation or oxynitridation. Alternatively, the at least one gate dielectric layer 4 can be formed by a deposition process such as, for example, chemical vapor deposition (CVD), plasma-assisted CVD, atomic layer deposition (ALD), evaporation, reactive sputtering, chemical solution deposition and other like deposition processes. The at least one gate dielectric layer 4 may also be formed utilizing any combination of the above processes.

The at least one gate dielectric layer 4 may be comprised of an insulating material including, but not limited to, an oxide, nitride, oxynitride and/or silicate. In one embodiment, the at least one gate dielectric layer 4 may be comprised of an oxide such as, for example, $SiO_2$, $HfO_2$, $ZrO_2$, $Al_2O_3$, $TiO_2$, $La_2O_3$, $SrTiO_3$, $LaAlO_3$, and mixtures thereof, including the addition of silicon and nitrogen. The at least one gate dielectric layer 4 may also be composed of a high-k dielectric material. As used herein, the term "high-k" denotes a dielectric material having a dielectric constant at room temperature (e.g., 20° C. to 25° C.) that is greater than the dielectric constant of silicon oxide ($SiO_2$). For example, in one embodiment, the high-k dielectric material that provides the at least one high-k gate dielectric layer 4 may have a dielectric constant at room temperature, and atmospheric pressure, e.g., 1 atm, of 4.0 or greater. In another embodiment, the high-k dielectric material that provides the at least one gate dielectric layer 4 has a dielectric constant that is greater than 7.0. The high-k dielectric material of the at least one gate dielectric layer 4 may include, but is not limited to, an oxide, nitride, oxynitride and/or silicate including metal silicates and nitrided metal silicates. In one embodiment, the at least one gate dielectric layer 4 is comprised of an oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of high-k dielectrics suitable for use as the at least one gate dielectric layer 4 in the present method include hafnium silicate and hafnium silicon oxynitride. The physical thickness of each layer of the at least one gate dielectric layer 4 may vary, but typically, the at least one gate dielectric layer 4 has a thickness from 0.5 nm to 10 nm, with a thickness from 0.5 nm to 3 nm being more typical. After forming the at least one gate dielectric layer 4, blanket material layers for the gate electrodes are formed on the at least one gate dielectric layer 4 utilizing a deposition process, such as physical vapor deposition (PVD), CVD or evaporation. Although the at least one gate dielectric layer 4 is depicted as being a single material layer in the supplied figures, it is noted that the at least one gate dielectric layer 4 may be a multilayered structure of any number of dielectric compositions.

The gate electrode of the gate structures 10a, 10b may be a multilayered structure including at least one metal gate conductor layer 15b that is present in direct contact with the at least one gate dielectric layer 4, and at least one semiconductor gate conductor layer 15a that is present on the at least one metal gate conductor layer 15b. In one embodiment, the at least one metal gate conductor layer 15b is formed in direct contact with the gate dielectric layer 4. By "metal gate conductor layer" it is meant that the conductive structure is composed of metal elements, and that the metal gate conductor layer is not composed of a semiconductor element. The only possibility of semiconductor elements in the metal gate conductor layer is from intermixing, which would only be at the interface between the at least one metal gate conductor layer 15b and the at least one semiconductor gate conductor layer 15a. Examples of metals that can be used for the at least one metal gate conductor layer 15b include, but are not limited to: Al, W, Cu, Ti or other like conductive metals.

Although only one metal gate conductor layer 15b is depicted in FIGS. 2A-2C, it is noted that the at least one metal gate conductor layer 15b may be a multilayered structure having any number of metal compositions. Each layer of the at least one metal gate conductor layer 15b may have a thickness ranging from 1 nm to 30 nm. In another embodiment, the at least one metal gate conductor layer 15b has a thickness ranging from 2 nm to 7 nm.

In some embodiments, the at least one metal gate conductor layer 15b may be composed of a work function metal layer. In one embodiment, in which the semiconductor device is an n-type semiconductor device, such as an nFET, the work function metal layer that provides the at least one metal gate conductor layer 15b is an n-type work function metal layer. As used herein, an "n-type work function metal layer" is a metal layer that effectuates an n-type threshold voltage shift. As used herein, "threshold voltage" is the lowest attainable gate voltage that will turn on a semiconductor device, e.g., transistor, by making the channel of the device conductive. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In one embodiment, the work function of the n-type work function metal layer ranges from 4.1 eV to 4.3 eV. In one embodiment, the n-type work function metal layer is composed of at least one of TiAl, TaN, TiN, HfN, or combinations thereof.

The n-type work function metal layer can be deposited using chemical vapor deposition (CVD), atomic layer deposition (ALD), sputtering or plating. In one embodiment, the n-type work function metal layer is composed of titanium aluminum (TiAl) and is deposited using sputtering. Examples of sputtering apparatus that may be suitable for depositing the n-type work function metal layer include DC diode type systems, radio frequency (RF) sputtering, magnetron sputtering, and ionized metal plasma (IMP) sputtering.

In another embodiment, in which the semiconductor device is a pFET, the at least one metal gate conductor layer 15b may be a p-type work function metal layer. As used herein, a "p-type work function metal layer" is a metal layer that effectuates a p-type threshold voltage shift. In one embodiment, the work function of the p-type work function metal layer ranges from 4.9 eV to 5.2 eV. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero.

In one embodiment, the p-type work function metal layer may be composed of titanium and their nitrided/carbide. In one embodiment, the p-type work function metal layer is composed of titanium nitride (TiN). The p-type work function metal layer may also be composed of TiAlN, Ru, Pt, Mo, Co and alloys and combinations thereof. In one embodiment, the p-type work function metal layer comprising titanium nitride (TiN) may be deposited by a physical vapor deposition (PVD) method, such as sputtering. Examples of sputtering apparatus that may be suitable for depositing the p-type work function metal layer include DC diode type systems, radio frequency (RF) sputtering, magnetron sputtering, and ionized metal plasma (IMP) sputtering. In addition to physical vapor deposition (PVD) techniques, the p-type work function metal layer may also be formed using chemical vapor deposition (CVD) and atomic layer deposition (ALD).

In one embodiment, a semiconductor gate conductor layer 15a is formed in direct contact with the metal gate conductor layer 15b. By "semiconductor gate conductor layer" it is meant that the gate conductor is composed of semiconductor element that is free of metal elements. The semiconductor gate conductor layer 15a may be composed of a silicon containing material. Examples of silicon containing materials suitable for the semiconductor gate conductor layer 15a include, but are not limited to, silicon, single crystal silicon, polycrystalline silicon, silicon germanium, and amorphous silicon.

In one embodiment, the at least one semiconductor gate conductor layer 15a is provided by a doped semiconductor, such as n-type doped polysilicon. Although the at least one semiconductor gate conductor layer 15a is depicted as being a single material layer, it is noted that the at least one semiconductor gate conductor layer 15a may be composed of any number of semiconductor layers having any number of compositions. The at least one semiconductor gate conductor layer 15a may have a thickness that is as great as 100 nm. In another embodiment, at least one semiconductor gate conductor layer 15a may have a thickness ranging from 10 nm to 20 nm.

In one embodiment, the at least one semiconductor gate conductor layer 15a is deposited and then doped by ion implantation. The material for the semiconductor gate conductor layer 15a may be deposited using chemical vapor deposition (CVD). Variations of CVD processes suitable for depositing the material that provides the at least one semiconductor gate conductor layer 15a include, but are not limited to, Atmospheric Pressure CVD (APCVD), Low Pressure CVD (LPCVD) and Plasma Enhanced CVD (EPCVD), Metal-Organic CVD (MOCVD) and others. The at least one semiconductor gate conductor layer 15a may be doped using ion implantation following the deposition of the material for the at least one semiconductor gate conductor layer 15a. In another embodiment, the at least one semiconductor gate conductor layer 15a may be in-situ doped as the material layer for the at least one semiconductor gate conductor layer 15a is formed. The dopant concentration in the semiconductor gate conductor layer 15a may range from $1 \times 10^{19}$ atoms/cm$^3$ to $1 \times 10^{21}$ atoms/cm$^3$.

The at least one dielectric cap layer 20 may present in direct contact with the at least one semiconductor gate conductor layer 15a. The at least one dielectric cap layer 20 may be composed of a dielectric material that can be etched selectively to the at least one semiconductor containing gate conductor 15a. For example, the at least one dielectric cap layer 20 may be composed of an oxide, nitride or oxynitride material. It is noted that the above materials for the at least one dielectric cap layer 20 are provided for illustrative purposes only, and are not intended to limit the present disclosure, as any dielectric material may be utilized for the at least one dielectric cap layer 20. For example, any material having a room temperature, e.g., 20° C. to 25° C., conductivity that is less than about $10^{-10} (\Omega\text{-m})^{-1}$ may be employed for the at least one dielectric cap layer 20. In one embodiment, the at least one dielectric cap layer 20 may have a thickness that is as great as 70 nm. In another embodiment, the dielectric cap layer 30 may have a thickness ranging from 10 nm to 20 nm. Although the at least one dielectric cap layer 20 is depicted as a single material layer in the supplied figures, the at least one dielectric cap layer 20 may be composed of any number of material layers, and may include any number of compositions.

In one embodiment, the gate structures 10a, 10b are formed by depositing blanket layers for each of the at least one gate dielectric layer 4, the at least one metal gate conductor layer 15b, the at least one semiconductor gate conductor layer 15a, and the at least one dielectric cap layer 20 to form a gate stack, and then patterning and etching are performed on the gate stack to form the gates structures 10a, 10b. More specifically, a pattern is produced on the gate stack by applying a photoresist to the surface to be etched, exposing the photoresist to a pattern of radiation, and then developing the pattern into the photoresist utilizing a resist developer. Once the patterning of the photoresist is completed, the sections covered by the photoresist are protected, while the exposed regions are removed using a selective etching process that removes the unprotected regions. As used herein, the term "selective" in reference to a material removal process denotes that the rate of material removal for a first material is greater than the rate of removal for at least another material of the structure to which the material removal process is being applied. For example, a first material may be removed with a selectivity of greater than 100:1 to a second material. It is noted that separate material stacks may be formed for to provide each of the gate structures 10a, 10b so that the compositions for the first gate structure 10a may differ from the second gate structure 10b. The remaining portion of the gate stacks that provides the gate structures 10a, 10b is positioned on at least channel region of the first active regions 25a, 25b and the second active regions 30a, 30b. In the embodiment that is depicted in FIGS. 2A-2C, each of the first and second gate structures 10a, 10b extend from a first active region 25a, 25b, across the isolation region 5 to a second active region 30a, 30b. Although only two gate structures 10a, 10b are depicted in the supplied figures, any number of gate structures 10a, 10b are within the scope of the present disclosure.

FIGS. 2A-2C also depict one embodiment of forming at least one spacer 6 on the sidewall of the gate structures 10a, 10b, and forming source regions 11a, 11b, 11c, 11d and drain regions 12a, 12b, 12c, 12d in the semiconductor substrate 1. The material of the at least one spacer 6 is typically a dielectric material. For example, the at least one spacer 6 may be an oxide, nitride or oxynitride material. In one example, the at least one spacer 6 is composed of silicon oxide. In another example, the at least one spacer 6 is composed of silicon nitride. In one embodiment, the material layer for the at least one spacer 6 may be formed using thermal growth or deposition in combination with etching. In one embodiment, the at least one spacer 6 was a width that ranges from 1.0 nm to 50.0 nm. In another embodiment, the at least one spacer 6 has a width that ranges from 10.0 nm to 20.0 nm.

In one embodiment, the source regions 11a, 11b, 11c, 11d and the drain regions 12a, 12b, 12c, 12d are formed on opposing sides of the gate structures 10a, 10b within the substrate 1 for each of the first active regions 25a, 25b and the second active regions 30a, 30b. As used herein, the term "source" is a doped region in the semiconductor device, in which majority carriers are flowing into the channel. As used herein, the term "channel" is the region underlying the gate structure and between the source region and drain region of a semiconductor device that becomes conductive when the semiconductor device is turned on. The term "drain" means a doped region in semiconductor device located at the end of the channel, in which carriers are flowing out of the semiconductor device through the drain. Each of the source regions 11a, 11b, 11c, 11d and the drain regions 12a, 12b, 12c, 12d may include an extension region and a deep implant region. In some embodiments, the source regions 11a, 11b, 11c, 11d and the drain regions 12a, 12b, 12c, 12d may each include a halo dopant region that is adjacent to the channel, wherein the halo dopant region has a conductivity that is typically opposite the extension regions and the deep implant regions. In the embodiments, in which the first active regions 25a, 25b are processed to provide the sites for n-type semiconductor devices, the source and drain regions 11a, 12a, 11d, 12d are doped to an n-type conductivity. In the embodiments, in which the second active regions 30a, 30b are processed to provide the sites for p-type semiconductor devices, the source and drain regions 11b, 12b, 11c, 12d are doped to a p-type conductivity. The dopant for the source and drain regions 11a, 11b, 11c, 11d, 12a, 12b, 12c, 12d may be introduced to the first and second active regions 25a, 25b, 30a, 30b of the substrate 1 using ion implantation.

In one embodiment, forming the source and drain regions 11a, 11b, 11c, 11d, 12a, 12b, 12c, 12d includes forming a first block mask (not shown) over the at least one second active region 30a, 30b, implanting the first conductivity type dopant to provide the source regions 11a, 11d and the drain regions 12a, 12d in the at least one first active region 25a, 25b, removing the first block mask, forming a second block mask (not shown) over the at least one first active region 25a, 25b, and implanting the second conductivity type dopant to provide the source regions 11b, 11c and the drain regions 12b, 12c in the at least one second active region 30a, 30b. The concentration of dopant in the source and drain regions 11a, 11b, 11c, 11d, 12a, 12b, 12c, 12d of the first active region 25a, 25b, and/or the second active region 30a, 30b may range from $1 \times 10^{18}$ atoms/cm$^3$ to $1 \times 10^{21}$ atoms/cm$^3$.

In addition to the "gate first" process sequence that is described above, in which the gate structure 15 formed prior to the source regions and the drain regions. The methods and structures disclosed herein are equally applicable to a "gate last" (also referred to as "replacement gate") sequence. In a "gate last" process sequence, a replacement gate is first formed on the portion of the active device regions that provide the channel region of the semiconductor device. The source and drain regions may then be formed in the active device region while the replacement gate is in place. Following the formation of the source and drain regions, the replacement gate is removed and a functional gate structure is formed in its' place. In some embodiments, the "gate last" process sequence may be employed to avoid subjecting the functional gate structure to the activation anneal for the source and drain regions. In a "gate first" process the activation anneal is typically performed after doping the source and drain regions.

FIGS. 3A-3D depict one embodiment of forming an opening 40 in a portion of the at least one dielectric cap layer 20 to expose a contact portion of the at least one semiconductor gate conductor layer 15b over the isolation region 5. The opening 40 may be formed using, photolithography, and selective etch processing. More specifically, an etch mask (not shown) may first be formed over the substrate 1 having an opening 40 corresponding to the portion of the at least one dielectric cap layer 20 that is over the isolation region 5. The etch mask may comprise soft and/or hardmask materials and can be formed using deposition, photolithography and etching.

In one embodiment, the etch mask is composed of a photoresist material. A patterned photoresist can be produced by applying a blanket photoresist layer to the surface of the substrate 1 covering the gate structures 10a, 10b, exposing the photoresist layer to a pattern of radiation, and then developing the pattern into the photoresist layer utilizing resist developer. In another embodiment, the etch mask is composed of a hardmask material. In one example, the hardmask may be composed of a nitride-containing material, such as silicon nitride. It is not intended that the etch mask be limited to only silicon nitride, as the composition of the hardmask may include any dielectric material that may be deposited by chemical vapor deposition (CVD) and related methods. Other hardmask compositions for the etch mask may include silicon oxides, silicon oxynitrides, silicon carbides, silicon carbonitrides, etc. Spin-on dielectrics may also be utilized as a hardmask material including, but not limited to, silsequioxanes, siloxanes, and boron phosphate silicate glass (BPSG). In one embodiment, an etch mask comprising a hardmask material may be formed by blanket depositing a layer of hardmask material, providing a patterned photoresist atop the layer of hardmask material, and then etching the layer of hardmask material to provide an etch mask protecting at least the portion of the gate structures 10a, 10b overlying the first active regions 25a, 25b and the second active regions 30a, 30b. The opening formed in the layer of the hardmask material exposes a portion of the dielectric cap layer 20 that is present over isolation region 5 that is removed to provide the opening.

In one embodiment, following formation of the etch mask, the exposed portion of the at least one dielectric cap layer 20 that is present over the isolation region 5 is removed using an etch process to expose a contact portion of the at least one semiconductor gate conductor layer 15a. In one embodiment, the exposed portion of the at least one dielectric cap layer 20 is removed by an etch that is selective to the underlying at least one semiconductor gate conductor layer 15a, as well as being selective to the etch mask. In one embodiment, the etch process may be an anisotropic etch process, such as reactive ion etch (RIE). The opening 40 that is formed through the at least one dielectric cap layer 20 may have a length L1 ranging from 10 nm to 1×10⁶ nm, and a width W1 ranging from 10 nm to 1×10⁸ nm. In another embodiment, the opening 40 that is formed through the at least one dielectric cap layer 20 may have a length L1 ranging from 10 nm to 1000 nm, and a width W1 ranging from 10 nm to 1000 nm. The opening 40 may be formed by a single mask, in which the opening through the single mask is depicted as M1 in FIG. 3A.

Following forming the opening 40 through the at least one dielectric cap layer 20 that is over the isolation region 5, a remaining portion of the at least one dielectric cap layer 20 is present over and protecting at least a portion of the at least one semiconductor gate conductor layer 15a that is present in the first active regions 25a, 25b, and the second active regions 30a, 30b. In some embodiments, the etch mask that is employed to form the opening 40 may remain over the first active regions 25a, 25b and the second active regions 30a, 30b during the formation of the subsequently described metal semiconductor alloy and the subsequently described interconnect. By remaining over the first and second active regions 25a, 25b, 30a 30b, the etch mask used to form the opening 40 though the at least one dielectric layer 20 protects the first and second active regions 25a, 25b, 30a, 30b from the following process steps used to form the metal semiconductor alloy and the interconnect.

FIGS. 4A-4D depict forming a metal semiconductor alloy 50 in the opening through the at least one dielectric cap layer 20, wherein the metal semiconductor alloy 50 is only present over the isolation region 5 and does not extend over the first active regions 25a, 25b and the second active regions 30a, 30b. A "metal semiconductor alloy" is an alloy of a metal and semiconductor. An alloy is mixture or solid solution, in which the atoms of the metal are replacing or occupying interstitial positions between the atoms of the semiconductor. Metal semiconductor alloy 50 formation typically requires depositing a metal, such as cobalt, nickel, or titanium, onto the surface of a semiconductor containing material. Following deposition, the structure is subjected to an annealing process such as, but not limited to, rapid thermal annealing. During thermal annealing, the deposited metal reacts with semiconductor forming a metal semiconductor alloy. For example, a metal reacting with silicon as described above typically forms a silicide. The remaining non-reacted metal is removed by an etch process selective to metal semiconductor alloy 50. In one example, the metal semiconductor alloy 50 may be composed of nickel silicide (NiSi$_x$). Other examples of compositions for the metal semiconductor alloy 50 may include, nickel platinum silicide (NiPt$_y$Si$_x$), cobalt silicide (CoSi$_x$), tantalum silicide (TaSi$_x$), titanium silicide (TiSi$_x$) and combinations thereof. Because the remaining portion of the at least one dielectric cap layer 20 is present over the first active regions 25a, 25b and the second active regions 30a, 30b, the metal semiconductor alloy 50 is obstructed from being formed on the portion of the at least one semiconductor gate conductor 15b that is present over first active regions 25a, 25b and the second active regions 30a, 30b. In some embodiments, the etch mask used to form the opening may remain over the first active regions 25a, 25b and the second active regions 30a, 30b to obstruct the metal semiconductor alloy from being formed on the first active regions 25a, 25b and the second active regions 30a, 30b. Therefore, the metal semiconductor alloy 50 is only formed on the contact portion of the at least one semiconductor gate conductor layer 15a that is exposed by the opening in the at least one dielectric cap layer 20, which is present over the isolation region 5.

Figure 5A:
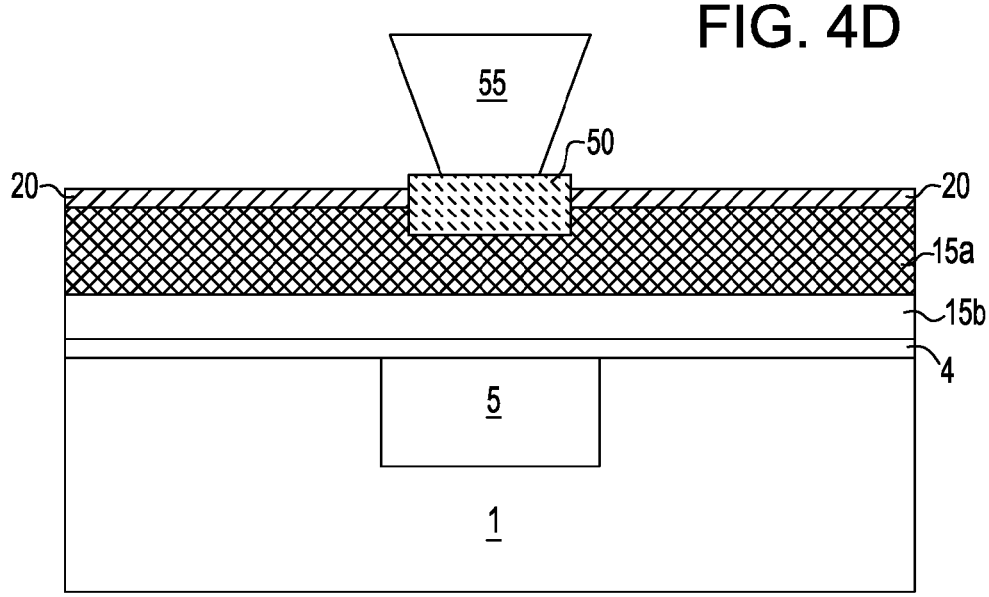
Figure 5B:
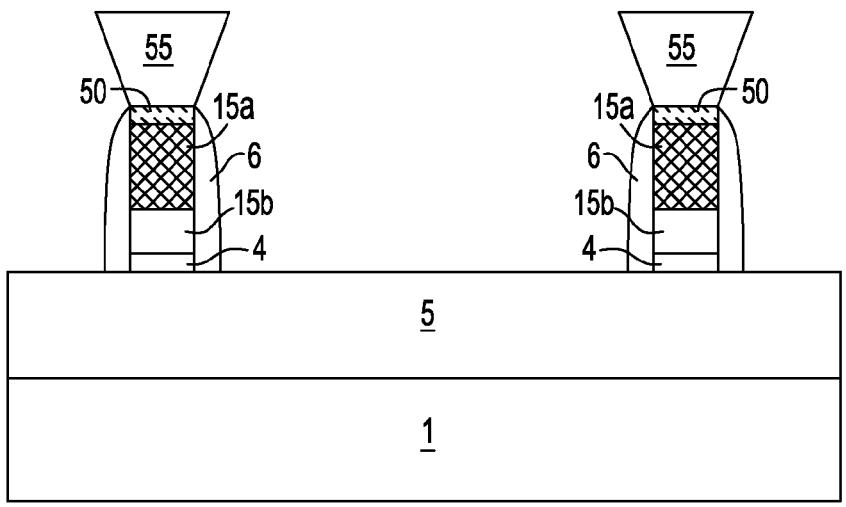

FIGS. 5A and 5B depict one embodiment of forming interconnects 55 to the metal semiconductor alloy 50 that is present over the isolation region 5. The interconnects 55 may be formed through an interlevel dielectric layer (not shown) that is blanket deposited over the substrate 1. The interlevel dielectric layer may be selected from the group consisting of silicon containing materials such as SiO$_2$, Si$_3$N$_4$, SiO$_x$N$_y$, SiC, SiCO, SiCOH, and SiCH compounds; the above-mentioned silicon containing materials with some or all of the Si replaced by Ge; carbon doped oxides; inorganic oxides; inorganic polymers; hybrid polymers; organic polymers such as polyamides or SiLK™; other carbon containing materials; organo-inorganic materials such as spin-on glasses and silsesquioxane-based materials; and diamond-like carbon (DLC, also known as amorphous hydrogenated carbon, α-C:H). Additional choices for the interlevel dielectric layer include any of the aforementioned materials in porous form, or in a form that changes during processing to or from being porous and/or permeable to being non-porous and/or non-permeable. The interlevel dielectric layer may then patterned and etched to form via holes to the metal semiconductor alloy 50 that is present over the isolation region 5. Following via formation, interconnects 55 are formed by depositing a conductive metal into the via holes using deposition methods, such as CVD, sputtering or plating. The conductive metal may include, but is not limited to: tungsten, copper, aluminum, silver, gold and alloys thereof.

Figure 4A:
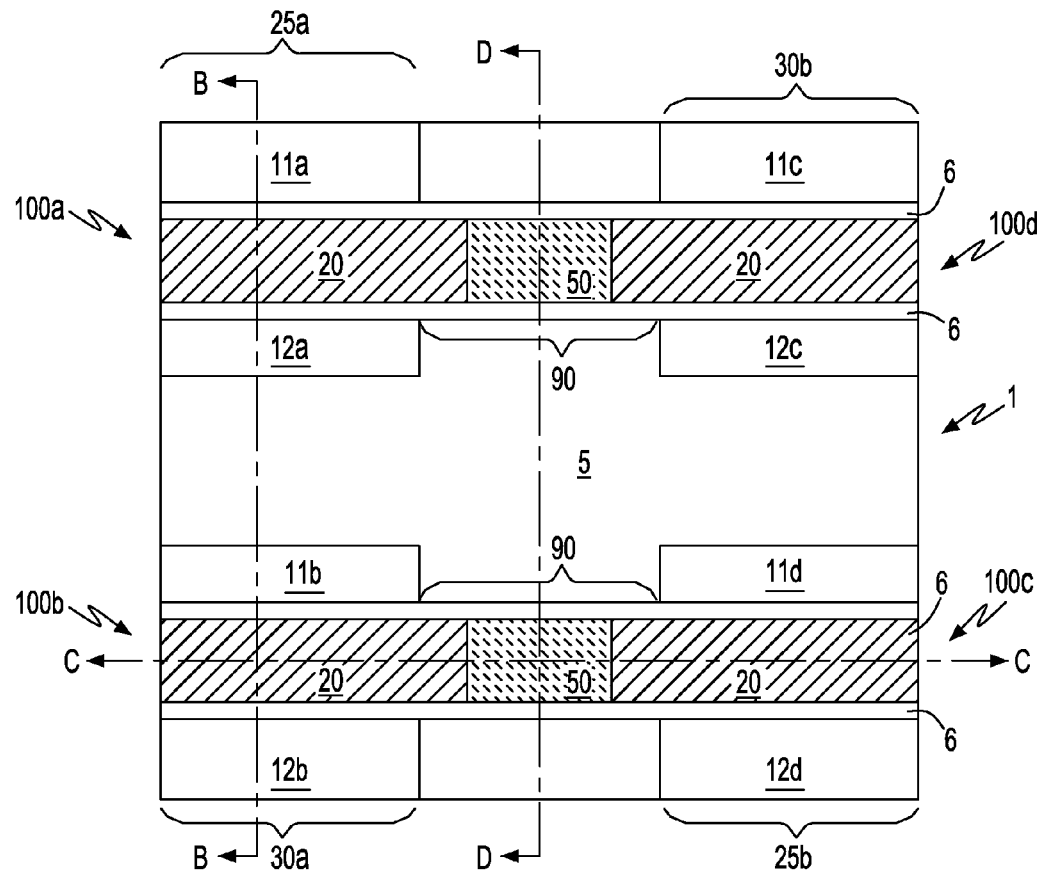
FIG. 4A is a top down planar view that depicts forming a metal semiconductor alloy in the opening through the dielectric cap layer, wherein the metal semiconductor alloy is only present over the isolation region and does not extend over the first active regions and the second active regions, in accordance with one embodiment of the present disclosure.
Figure 4B:
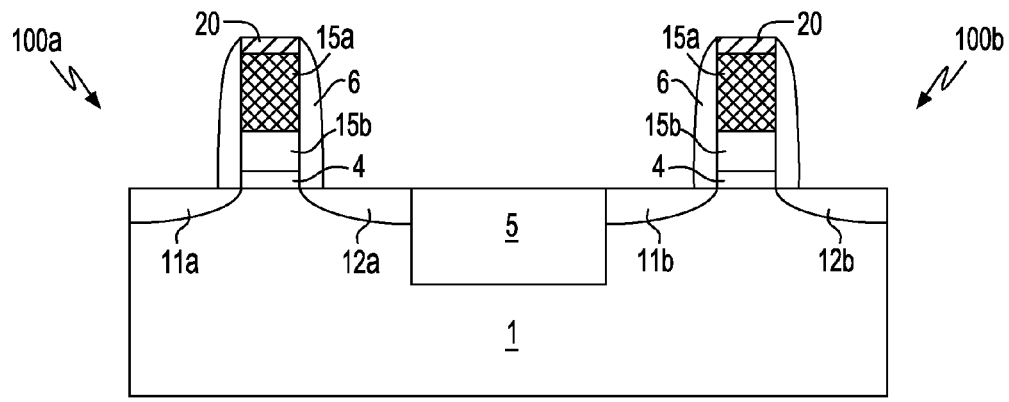
FIG. 4B is a side cross-sectional view along section line B-B of FIG. 4A.
Figure 4C:
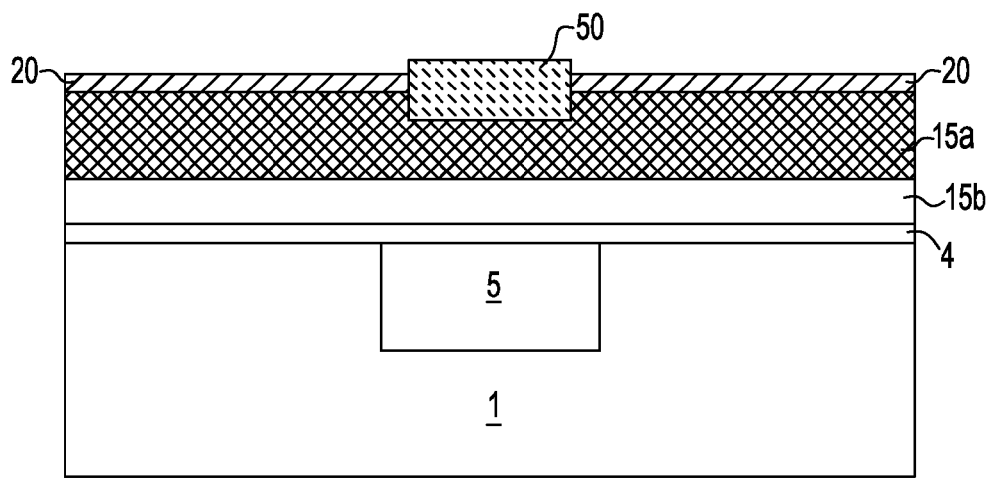
FIG. 4C is a side cross-sectional view along section line C-C of FIG. 4A.
Figure 4D:
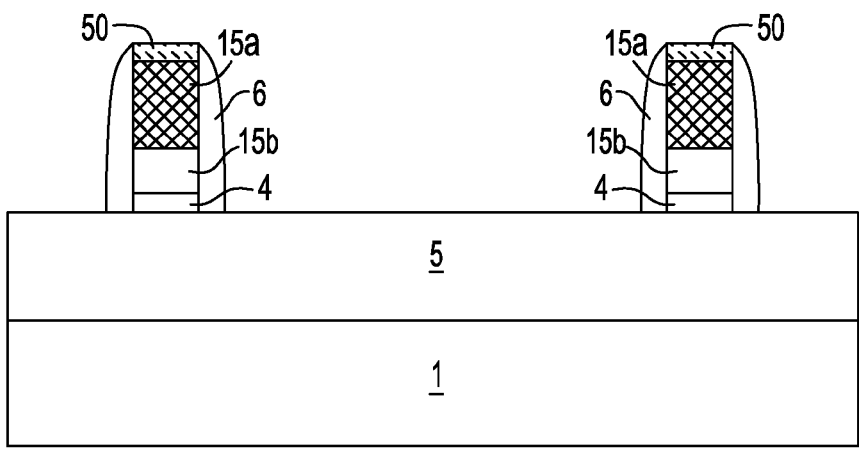
FIG. 4D is a side cross-sectional view along section line D-D of FIG. 4A.

FIGS. 4A-4C depict a complementary metal oxide semiconductor (CMOS) device that includes a substrate 1 including at least one first active region 25a, 25b and at least one second active region 30a, 30b, wherein each of the at least one first active region 25a, 25b and each of the at least one second active region 30a, 30b of the substrate 1 are separated by from one another by an isolation region 5 positioned therebetween. A semiconductor device 100a, 100c having n-type conductivity source and drain regions 11a, 12a, 11d, 12d (hereafter referred to as n-type semiconductor device 100a) is present on the least one of the first active region 25a, 25b of the substrate 1. A semiconductor device 100b, 100d having p-type conductivity source and drain regions 11b, 12b, 11c, 12c (hereafter referred to as a p-type semiconductor device 100b) is present on at least one of the second active region 30a, 30b of the substrate 1.

The n-type semiconductor device 100a, 100c includes a first portion of a gate structure 10a, 10b and the p-type semiconductor device 100b, 100d includes a second portion of the gate structure 10a, 10b, wherein the first and second portion of the gate structure 10a, 10b are separated by a connecting gate portion 90 that is present on the isolation region 5. As described above, each gate structure 10a, 10b includes at least one gate dielectric layer 4, at least one metal gate conductor layer 15b, at least one semiconductor gate conductor layer 15a, and at least one dielectric cap layer 20. The at least one dielectric cap layer 20 includes an opening there through over the isolation region 5. A metal semiconductor alloy 50 is present in the opening providing an electrical contact to the connecting gate portion 90 of the gate structures 10a, 10b which is present over the isolation region 5.

Electrical communication between the first portion of the gate structure 10a, 10b of the n-type semiconductor device 100a, 100c that is present on the first active region 25a, 25b and the second portion of the gate structure 10a, 10b of the p-type semiconductor device 100b, 100d that is present on the second active region 30a, 30b is provided by a metal gate conductor layer 15b (also referred to as metal gate conductor portion) that is common to both the first portion of the gate structure 10a, 10b and the second portion of the gate structure 10a, 10b. By "common" it is meant that the metal gate conductor layer 15b of the first and second portions of the gate structure 10a, 10b and the connecting portion 90 of the gate structure 10a, 10b are the same continuous metal gate conductor layer 15b. By "electrical communication" it is meant that the electrical signal that dictates the "on" and/or "off" state of the n-type semiconductor device 100a, 100c and the p-type semiconductor device 100b, 100d is transmitted from the metal semiconductor alloy 50 to the underlying portion of the semiconductor gate conductor layer 15a to the metal gate conductor layer 15b over the isolation region 5, and is then transmitted from the portion of the metal gate conductor layer 15b that is over the isolation region 5 to the portion of the metal gate conductor layer 15b that is present over the channel region of the n-type and p-type semiconductor device 100a, 100b, 100c, 100d in the first and second active regions 25a, 25b, 30a, 30b of the substrate 1. The electrical signal may be transmitted in both the doped silicon of the at least one semiconductor gate conductor layer 15a, and the metal gate conductor layer 15b over the isolation region 5 that is between the at least one first active region 25a, 25b and the at least one second active region 30a, 30b.

FIGS. 6A-7B depict another embodiment of the present disclosure, in which each gate structure 10c, 10d is formed extending across the isolation region 5 and spanning from a first active region 25a, 25b, to a second active region 30a 30b, wherein the gate structure 10c, 10d include at least one dielectric cap layer 200 over at least one metal gate conductor layer 150, in which the at least one metal gate conductor layer 150 is present over at least one gate dielectric layer 400. The at least one metal gate conductor layer 150 may be in direct contact with the at least one dielectric cap layer 200, and the at least one metal gate conductor layer 150 may be in direct contact with the at least one gate dielectric layer 400. In this embodiment, the gate structure 10c, 10d does not include a semiconductor gate conductor layer. In this embodiment, interconnects 55 extend through the at least one dielectric cap layer 200 over the isolation region 5 into direct contact with an upper surface of the at least one metal gate conductor layer 150. In one embodiment, because a semiconductor gate conductor layer is not present over the at least one metal gate conductor layer 150, there are no metal semiconductor alloy regions between the interconnects 55 and the at least one metal gate conductor layer 150. Similar to the embodiments described above with reference to FIGS. 1A-5B, a remaining portion of the dielectric cap layer 200 is present over the first active regions 25a, 25b and the second active regions 30a, 30b. Electrical contact by the interconnect 55 to the gate structure 10c, 10d is only over the isolation region 5.

Figure 6A:
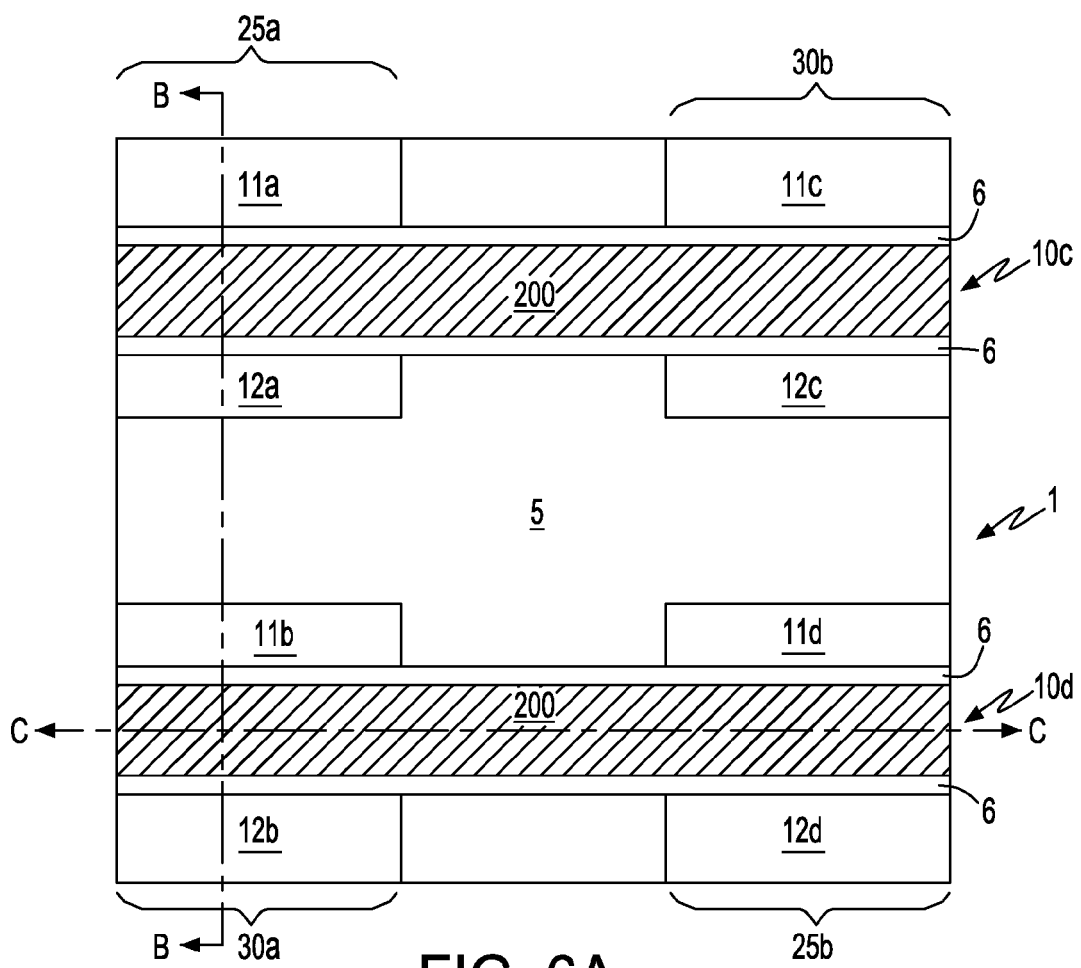
FIGS. 6A-6C depict another embodiment of the present disclosure in which gate structures are formed extending across the isolation region and spanning from the first active regions to the second active regions, in which each of the gate structures includes a dielectric cap layer over a metal gate conductor layer that is present over a gate dielectric layer.
Figure 6B:
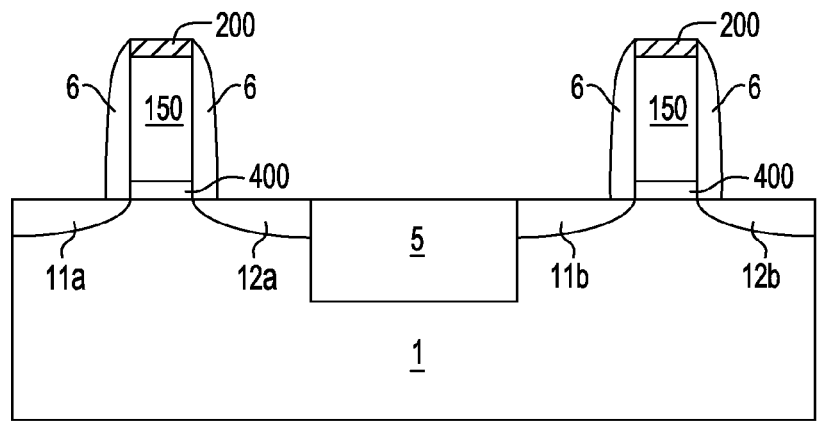
Figure 6C:
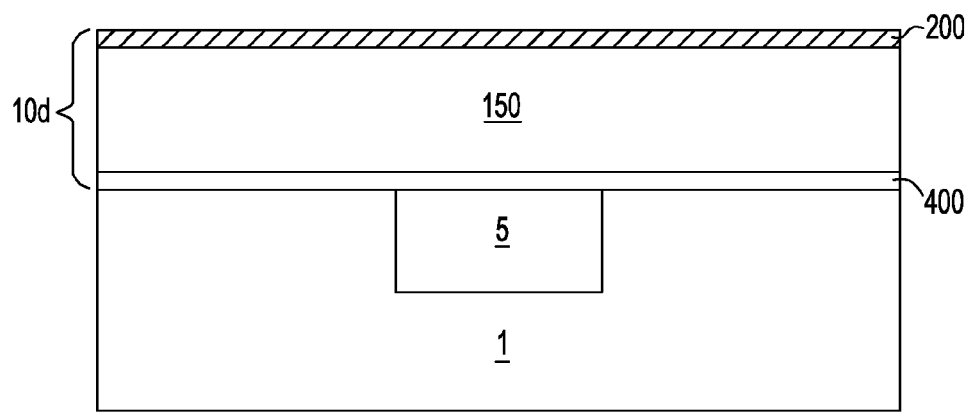

The structure depicted in FIGS. 6A-6C is similar to the structure described above with reference to FIGS. 2A-2C. The composition, dimensions and method of forming the at least one dielectric cap layer 200 that is depicted in FIGS. 6A-6C is similar to the composition, dimensions and method of forming the at least one dielectric cap layer 20 that is described above with reference to FIGS. 2A-2C. The composition, dimensions and method of forming the at least one metal gate conductor layer 150 that is depicted in FIGS. 6A-6C is similar to the composition, dimensions and method of forming the at least one metal gate conductor layer 15b that is described above with reference to FIGS. 2A-2C. The composition, dimensions and method of forming the gate dielectric layer 4 that is depicted in FIGS. 6A-6C is similar to the composition, dimensions and method of forming the gate dielectric layer 4 that is described above with reference to FIGS. 2A-2C. The substrate 1, isolation region 5, first active regions 25a, 25b, second active regions 30a, 30b, source regions 11a, 11b, 11c, 11d, and drain regions 12a, 12b, 12c, 12d that are depicted in FIGS. 6A-6C have also been described above with reference to FIGS. 1A-2C.

Figure 7A:
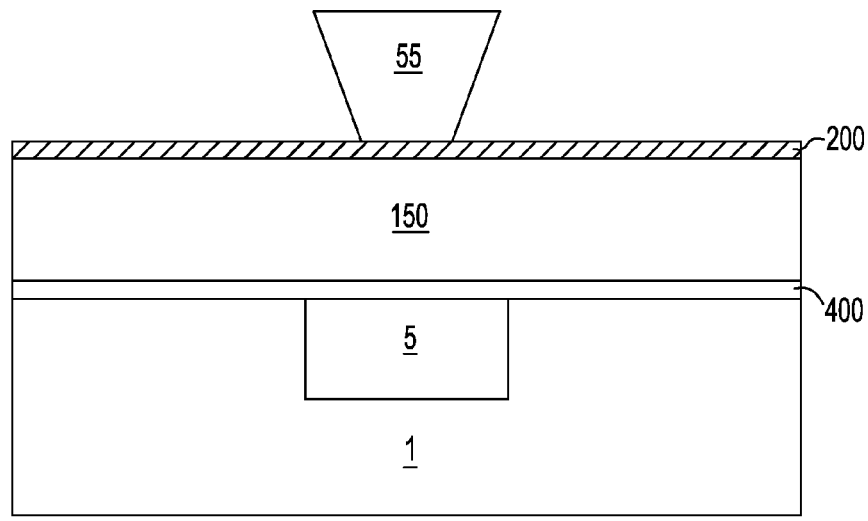
Figure 7B:
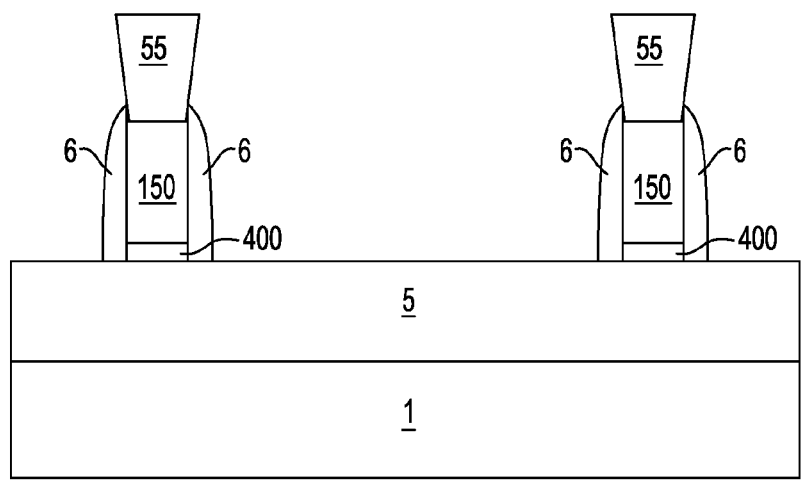

FIGS. 7A and 7B depict forming an interconnect 55 in contact with the exposed surface of the metal gate conductor layer 150. The interconnect 55 that is depicted in FIGS. 7A and 7B is similar to the interconnect 55 that is depicted in FIGS. 5A and 5B with the exception that the interconnect 55 depicted in FIGS. 5A and 5B is formed in direct contact with a metal semiconductor alloy 50 that is formed atop the upper surface of the semiconductor gate conductor layer 15a, and in FIGS. 7A and 7B the interconnect 55 is in direct contact with the upper surface of the metal gate conductor layer 150. Therefore, the description of forming the interconnect 55 that is depicted in FIGS. 5A and 5B is suitable for forming the interconnect 55 that is depicted in FIGS. 7A and 7B.

The metal gate conductor 150 that is depicted in FIGS. 6A-7B provides electrical communication between the first portion of the gate structure 10c, 10d of the n-type semiconductor device 100a, 100c that is present on the first active regions 25a, 25b and the second portion of the gate structure 10c, 10d of the p-type semiconductor device 100b, 100d that is present on the second active regions 30a, 30b. The metal gate conductor 150 is common to both the first portion of the gate structure 10c, 10d and the second portion of the gate structure 10c, 10d. By "electrical communication" it is meant that the electrical signal that dictates the "on" and/or "off" state of the n-type semiconductor device 100a, 100c and p-type semiconductor device 100b, 100d is transmitted from the interconnect 50 to the metal gate conductor layer 150 that is over the isolation region 5, and is then transmitted from the portion of the metal gate conductor layer 150 that is over the isolation region 5 to the portion of the metal gate conductor layer 150 that is present over the channel region of the n-type and p-type semiconductor device 100a, 100b, 100c, 100d in the first and second active regions 25a, 25b, 30a, 30b of the substrate 1.

In some embodiments, the methods disclosed herein protect the gate structures that are overlying the active regions of the substrate while removing the dielectric cap layer that is over the gate structure in providing electrical contact to the gate structures. The methods may also protect spacer integrity in the active regions of the substrate. The gate conductors in the active regions of the substrate are also protected for silicidation processes that may short the devices.

While the claimed methods and structures has been particularly shown and described with respect to preferred embodiments thereof, it will be understood by those skilled in the art that the foregoing and other changes in form and details may be made therein without departing from the spirit and scope of the presently claimed methods and structures.

What is claimed is:

1. A method of forming a CMOS device, said method comprising:
    forming at least one isolation region in a semiconductor substrate to provide at least one first active region and at least one second active region;
    forming a gate structure extending across said at least one isolation region and spanning from said at least one first active region to said at least one second active region, wherein said gate structure includes at least one gate dielectric layer, at least one gate conductor layer, and at least one dielectric cap layer;
    forming a first source region and a first drain region of a first conductivity type on opposing sides of said gate structure in said at least one first active region, and a second source region and a second drain region of a second conductivity type on opposing sides of said gate structure in said at least one second active region;

forming an opening in a portion of said at least one dielectric cap layer to expose a contact portion of said at least one gate conductor layer over said at least one isolation region, wherein a remaining portion of said at least one dielectric cap layer is present over said at least one first active region and said at least one second active region; and forming an interconnect in direct contact with said contact portion of said at least one gate conductor layer.

2. The method of claim 1, wherein said forming said first source region, said first drain region, said second source region, and said second drain region comprises:

forming a spacer adjacent to said gate structure in said at least one first active region and said at least one second active region;

forming a first block mask over said at least one second active region;

implanting said first conductivity type dopant in said at least one first active region to provide said first source region and said first drain region;

removing said first block mask;

forming a second block mask over said at least one first active region; and implanting said second conductivity type dopant in said at least one second active region to provide said second source region and said second drain region.

3. The method of claim 2, wherein said first conductivity type dopant is an n-type dopant and said second conductivity type dopant is a p-type dopant.

4. The method of claim 2, wherein said at least one gate conductor layer comprises a metal gate conductor layer over said at least one gate dielectric and a semiconductor gate conductor layer over said metal gate conductor layer.

5. The method of claim 4, wherein prior to forming said interconnect, a metal semiconductor alloy is formed on said semiconductor gate conductor layer to provide said contact portion of said gate structure.

6. The method of claim 5, wherein said metal semiconductor alloy that is formed on said contact portion of said gate structure is only present over said isolation region and does not extend over at least one of said at least one first active region and said at least one second active region.

7. The method of claim 6, wherein said interconnect is in direct contact with said metal semiconductor alloy.

8. The method of claim 7, wherein said interconnect comprises a conductive metal.

9. The method of claim 8, wherein said conductive material is formed by chemical vapor deposition, sputtering or plating.

10. The method of claim 2, wherein said at least one gate conductor layer comprises a metal gate conductor layer over said at least one gate dielectric.

11. The method of claim 1, wherein said interconnect is in direct contact with said metal gate conductor layer.

12. The method of claim 1, wherein said forming said opening in said portion of said at least one dielectric cap layer to expose said contact portion of said at least one gate conductor layer comprises photolithography and etching.

13. The method of claim 12, wherein said etching comprises an anisotropic etching process.

14. The method of claim 1, wherein said forming said gate structure including providing a dielectric layer atop an uppermost surface of said at least one gate conductor layer.

* * * * *